United States Patent [19]
Whittaker

[11] Patent Number: 5,793,231
[45] Date of Patent: Aug. 11, 1998

[54] CURRENT MEMORY CELL HAVING BIPOLAR TRANSISTOR CONFIGURED AS A CURRENT SOURCE AND USING FIELD EFFECT TRANSISTOR (FET) FOR CURRENT TRIMMING

[75] Inventor: Edward John Wemyss Whittaker, Herts, United Kingdom

[73] Assignee: Northern Telecom Limited, Montreal, Canada

[21] Appl. No.: 844,189

[22] Filed: Apr. 18, 1997

[51] Int. Cl.$^6$ ............... H03K 17/00; G11C 27/02; H03M 1/80

[52] U.S. Cl. ............... 327/95; 327/91; 327/93; 327/94; 327/96; 327/432; 327/433; 341/153; 341/134; 341/136; 365/45; 365/177

[58] Field of Search ............... 327/91, 93, 94, 327/95, 96, 432, 433; 341/153, 136, 134; 365/45, 46, 177

[56] References Cited

U.S. PATENT DOCUMENTS

| | | | |
|---|---|---|---|
| 4,897,596 | 1/1990 | Hughes et al. | 323/315 |
| 5,113,129 | 5/1992 | Hughes | 323/316 |
| 5,293,166 | 3/1994 | Ta | 341/118 |
| 5,296,752 | 3/1994 | Groeneveld et al. | 327/91 |
| 5,323,157 | 6/1994 | Ledzius et al. | 341/143 |
| 5,450,084 | 9/1995 | Mercer | 341/153 |
| 5,548,288 | 8/1996 | Lueng | 341/136 |

OTHER PUBLICATIONS

H J Schouwenaars et al., "An oversampled Multibit CMOS D/A Conmverter", IEEE Journal of Solid State Physics, vol. 26, No. 12, Dec. 1991, pp. 1775–1780.

W Groeneveld et al., "Continuous Calibration D/A Conversion", Switched Currents an analogue technique for digital technology, Eds C Toumazou et al., IEE 1994, Chapter 15.

*Primary Examiner*—David C. Nelms
*Assistant Examiner*—Andrew Q. Tran
*Attorney, Agent, or Firm*—John D. Crane

[57] ABSTRACT

A current memory cell comprises a first bipolar transistor providing a current source and coupled to the emitters of a second and a third bipolar transistor, the latter forming the storage elements of the memory cell. The memory cell is calibrated, to avoid mismatch between the second and third transistors, by adjustment of the current source via a parallel arrangement of a resistor and a field effect transistor in the emitter circuit of the first transistor.

6 Claims, 2 Drawing Sheets

CURRENT MEMORY CELL HAVING BIPOLAR TRANSISTOR CONFIGURED AS A CURRENT SOURCE AND USING FIELD EFFECT TRANSISTOR (FET) FOR CURRENT TRIMMING

BACKGROUND OF THE INVENTION

The present invention relates to a current memory cell for applying to a current terminal during a hold interval, an output current which is substantially equal to an input current applied to the current terminal during a sample interval preceding the hold interval.

Current memory cells of this type are used as a current source that can be calibrated in accurate digital to analog converters and in delta-sigma data converters. The demands on the linearity of high resolution D/A and A/D converters are currently so high that the achievable accuracy based on the matching of components is not sufficient. Hence, additional calibration techniques have been used to achieve high resolution. This is particularly so in uses where a limited number of bits are envisaged but exceptional bit-to-bit matching is required. Such precision uses are found in multi-bit delta sigma ADC's and DAC's based on continuous time operation rather than switched capacitor realisation.

Various proposals have been made in the past for calibrating the memory cells and one such method is disclosed in U.S. Pat. No. 5,296,752 (Groeneveld et al). The technique there will be described in relation to FIG. 1 which shows partly diagrammatically how to calibrate a current memory cell. A current source transistor M 1 is to be calibrated at the reference current Iref. When switches M2 and M3 which are both MOS transistors are in the depicted state, a reference current Iref flows into transistor M 1, since it is connected as an MOS-diode. A voltage Vgs on the intrinsic gate-source capacitance Cgs of M 1 is then determined by the transistor characteristics. When switch S2 is opened and switch S1 is switched to the other position, the gate-to-source voltage Vgs of MOS transistor M1 is not changed since the charge on Cgs is preserved. Provided that the drain voltage is not changed either, the drain current of M 1 will still be equal to Iref. This current is now available at the out terminal in FIG. 1 and the reference current source is no longer needed.

As stated above, the switches S 1 and S2 are MOS transistors as is the current source transistor M1. This gives rise to some disturbing effects which cause changes in the gate voltage of M 1 during switching. A further difficulty with this arrangement is that MOS current steering devices are insufficiently fast for high speed DAC's and ADC's thus there is a need to provide a current memory cell which can be calibrated for use in accurate converters but which is faster than the existing circuits.

SUMMARY OF THE INVENTION

It is an object of the present invention to provide a current memory cell the speed of which is superior to existing memory cells but which can still be calibrated in use.

The present invention provides a current memory cell comprising a first current terminal and an output current terminal, a first transistor connected to form a current source, transistor means connected between said first and output current terminals and said current source whereby to selectively connect the current source to either the first current terminal or the output current terminal and means for trimming the current source wherein the current source comprises a bipolar transistor and the trimming means comprises a field effect transistor.

The advantage of using a bipolar transistor for the current source is that the amount of trimming required is reduced and the stability of the trim is improved as compared with an all field effect transistor realisation.

Preferably the second and third transistors are bipolar transistors connected as a long tailed pair. The advantage of using bipolar transistors is the speed at which they can be operated as compared with MOS transistors.

In a preferred embodiment of the present invention, an additional return to zero data structure is provided in order to eliminate intersymbol pattern sensitivity.

BRIEF DESCRIPTION OF THE DRAWINGS

In order that the present invention be more readily understood an embodiment thereof will now be described with reference to the accompanying drawings, in which.

DESCRIPTION OF THE PREFERRED EMBODIMENTS

Figure 1:
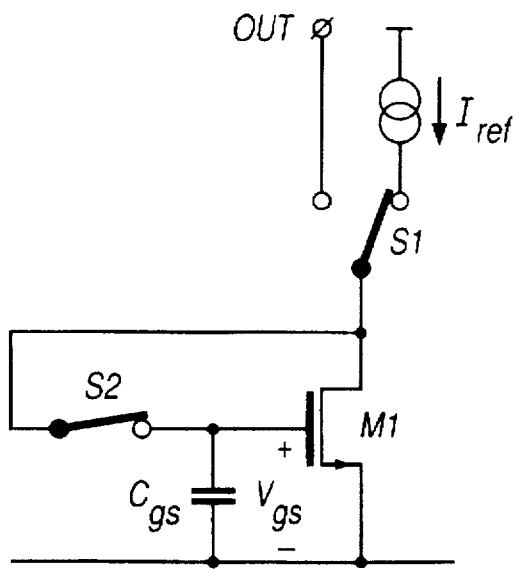
FIG. 1 shows a diagrammatic view of a prior art arrangement.

Before describing the present invention in detail, it is helpful to understand that the embodiment will be described in relation to its use in a multibit delta sigma converter. However, the current memory cell of the present invention can be used in other devices and so the succeeding description should not be taken as limiting.

Multi-bit delta signal converters offer many advantages over single bit designs, but had been often neglected due to difficulties in realising an accurate multi-bit digital-to-analog converter. Essentially, the delta sigma loop is a feedback system with the digital-to-analog converter forming the feedback element. The linearity of the delta sigma analog-to-digital converter cannot exceed the linearity of the digital-to-analog converter used for feedback, hence the popularity of the one bit systems which may be made entirely linear. The advantages of multi-bit digital-to-analog converters in delta sigma converters accrue from the improved accuracy of the capture of the signal at the output of the loop filter of the ADC and the attendant improvement in signal to noise ratio due to less quantization error. It is easy to understand that each bit improves the signal to noise ratio by 6 dB, and clearly the improvement in signal to noise ratio can be readily traded for a reduction in sample clock rate. The reduction in quantization error does however bring other benefits which are particularly important with higher order loops:

1. The loop gain may be increased right to the limit set by simple feedback theory thereby improving the signal to noise ratio further over a single bit design where high order loops have to be reduced in gain in order to stabilize them.

2. On single bit designs the energy associated with the chaotic behaviour of the loop (out of band noise) increasingly dominates the signal handling range of the ADC as the order of the loop is increased and so even more dynamic range is lost. On a multi-bit design more quantization levels of the ADC are occupied by the out of band noise but the collapse in signal handling may be much less than in a single bit design.

3. Lower quantization error reduces correction signals in the loop filter. This places a less stringent requirement on the loop filter amplifiers in terms of sleu range and signal handling.

For best accuracy in a binary weighted system multiple devices in parallel are used. In the limit all these current sources are identical with the least significant bit being represented by one current source and one set of steering switches the next bit by two the next bit by four and the next by eight. Thus a four bit binary source would incorporate 15 such sources and steering switches. If we now turn to FIG. 2, this shows a part of a calibrated current steering DAC where only one current memory cell is shown but it will be appreciated that a number of current memory sources will be present. In this case we envisage sixteen current memory cells being present although only one is shown.

The current memory cell is shown within broken lines and it should be understood that all circuitry outside the broken line is common to all sixteen current memory cells. Some logic signals are CMOS levels and are designated <SIG-NAME> CMOS, the remainder of the logic signals are differential current mode logic ECL. A first bipolar transistor Q1 has its emitter coupled to ground via a resistor R1 and forms a current source. The base of the transistor Q1 is connected to a reference voltage source and its collector is connected to the tail of a pair of bipolar transistors Q2 and Q3 which are connected as a long tailed pair. The bases of the transistors Q2 and Q3 are supplied with data via a current mode logic AND gate which is also supplied with clock signals. The collector of the transistor Q2 is connected to a first current terminal T while the collector of the transistor Q3 is connected to an output current terminal O, the use of the long tailed pair of transistors Q2 and Q3 results in a satisfactorily fast switch but unfortunately can result in a mis-match between the finite gains of the two transistors which in turn will cause a mis-match in the currents in the two collectors. It is therefore proposed to calibrate the current memory cell utilizing the bipolar long tailed pair and since calibration need not be carried out at the same speed as switching, MOS devices are suitable as a medium speed switch and have the advantage of requiring no gate current.

Calibration of the current memory cell principally relies on trimming the current source formed by the transistor Q1 and in the present example this is achieved by a field effect transistor M1 connected in parallel with the resistor R1 in the emitter circuit of the transistor Q1.

The sequence of the calibration process is as follows:

It is assumed that field effect transistor M1 is fully off and that transistor Q3 has no current flowing in it. The CMOS switches M2, M3 and M4 are switched into calibration mode with CMOS transistors M3 and M4 on and CMOS transistor M2 off.

The calibration loop is started by simultaneously allowing an integral number of clock pulses simultaneously to the gates of both transistors Q3 and Q4 in order to enable these transistors. Current flows through R1 into transistor Q1 and through transistor Q3 and CMOS transistor M3 to output terminal O where it is summed with a reference current Iref flowing through transistor Q4. Iref is slightly larger than the current flowing through transistor Q1 without the assistance of transistor M1 and so there is a resultant current at output terminal O which is fed to OPAMP 1 which in turn results in an error signal which is fed via OPAMP2 and transistor M4 to gate of transistor M1 which starts to conduct. OPAMP1 is an MOS based device so DC current is negligible and it is therefore possible to theoretically achieve a balance position at zero. Once this balance condition has been achieved, the calibration signal is removed from transistors M3 and M4 and the charge present on transistor M1 is retained due to the large gate capacitance which it exhibits. This trims the value of the current set by the transistor Q1 and retains the value between calibration cycles. Transistor M2 can then be switched on again and the calibration sequence is completed.

The accuracy of the calibration can be very great in principle. However it is degraded by a number of factors most of which can be reduced by ensuring that the capacitance of the transistor M1 is very large as compared with the capacitance of the transistor M4 and by giving the transistor M1 only the minimum transconductance necessary. Nevertheless, it is necessary to refresh the calibration from time to time.

Figure 3:
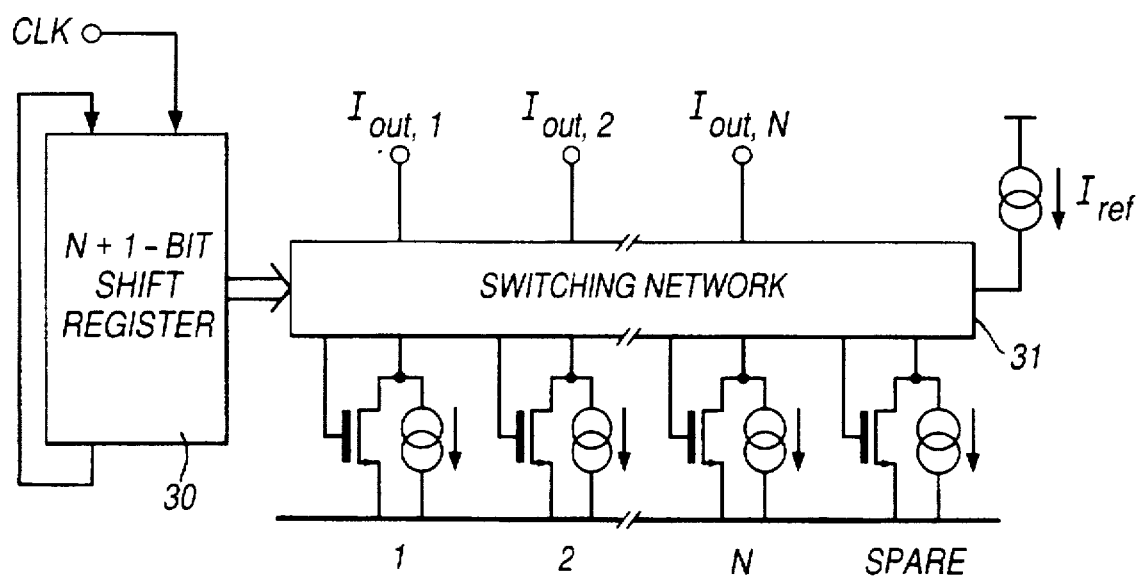
FIG. 3 shows a block diagram of a continuously operable arrangement.

If one now refers to FIG. 3 one will see diagrammatically a scheme whereby the calibration of the current memory cells can be refreshed without interrupting the flow of data through the devices. At present we prefer to refresh all current sources every 10 milliseconds in which case each source (of the sixteen) will have 625 microseconds to complete its calibration cycle. Most of this cycle time should be available for loop settling so a loop filter cut-off frequency of the order of 20 kHz would be suitable. The principle of the circuit shown in FIG. 3 is characterized by the presence of N normal and one spare current memory cells that generate N equal output currents. The selection of the cell to be calibrated is carried out by an N+1 stage shift register 30. System logic makes sure that only one stage contains a logic 1 while the other outputs are zero. Round coupling ensures that after sequentially calibrating all cells the first cell is calibrated again and so on. The switching network 31 is in fact the FET switches of each current memory cell previously described so that the output currents of the normally functioning cells are connected to their corresponding outputs. The one cell under calibration is connected to the reference source Iref which is common to all current memory cells. In this way, it is guaranteed that there are always N equal currents available at the output terminals which can be used in the converter.

Figure 2:
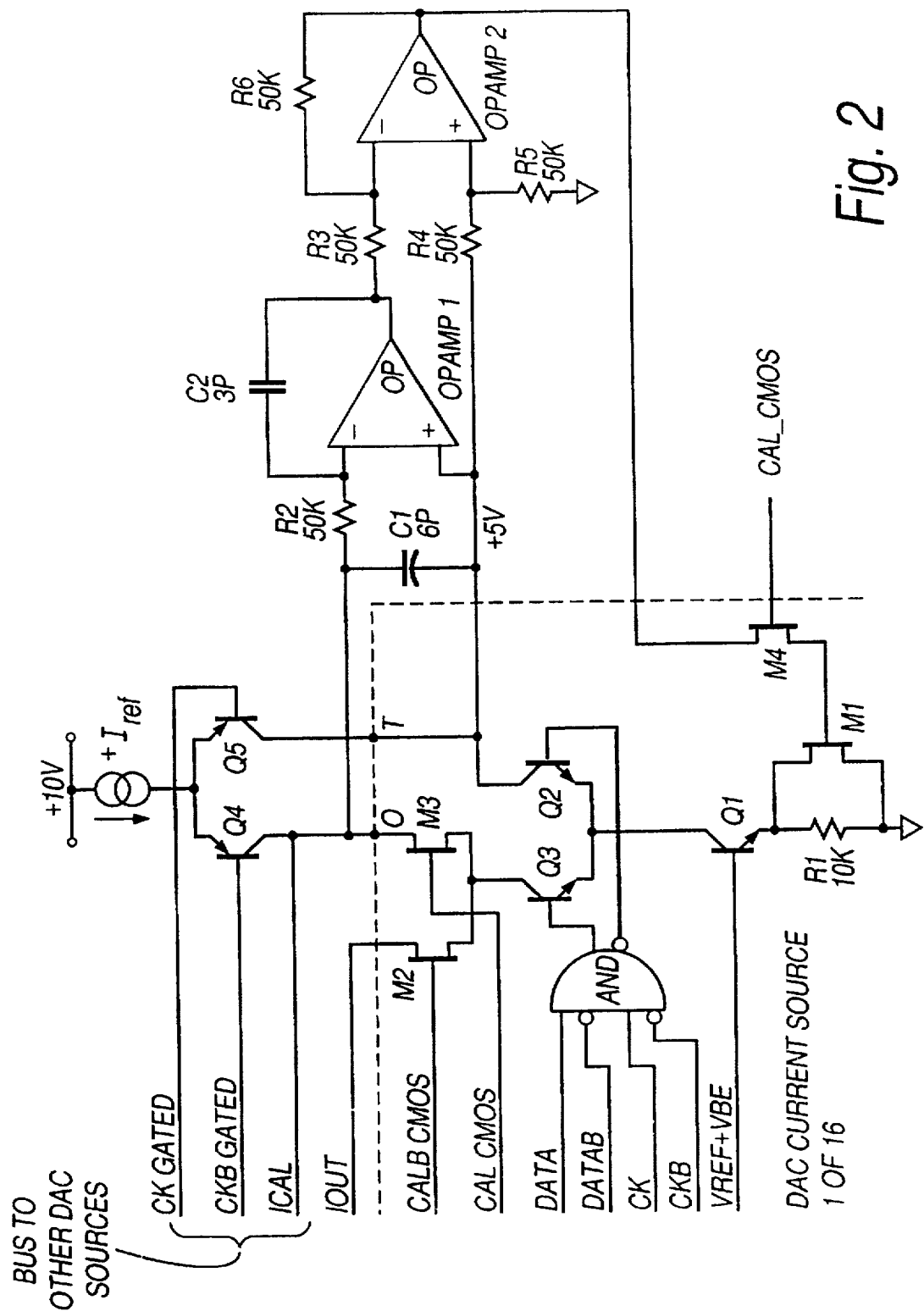
FIG. 2 shows an embodiment of the present invention.

The circuitry shown in FIG. 2 contains one additional advantageous circuit arrangement and that is it provides a return zero data structure in order to calibrate the charge (as opposed to the current) injected by the digital-to-analog converter each clock cycle into a delta sigma converter, thereby eliminating intersymbol pattern sensitivity on a calibrated digital-to-analog converter. This is achieved by virtue of the presence of the bipolar transistors Q2, Q3 in combination with the AND gate. Both the transistors Q2 and Q3 are gated by clock signals in synchronism with clock signals fed to the AND gate. During calibration the data input to the AND gate is at logic 1 and the clock pulses which gates the real data are fed to transistor Q3. In order to minimise slew in OPAMP 1, the transistor Q4 is similarly controlled with a level shifted version of the inverted clock which is fed via an AND gate. Since all sources are compared to the same reference and the clock pulse width of each source appears in the calibration process, the effect of variable clock pulse width on DC accuracy is eliminated. Similarly, since the same switching transistor Q3 is employed during both the calibration cycle and the normal operation of the source, its losses are calibrated out. Switching interference from transistors M2 and M3 is kept to a minimum since the calibration process need only occur at a rate of say 100 Hz not at the rate of the main clock which can be in excess of 100 MHZ.

A DAC for a multi-bit delta signal converter could be constructed using two calibrated current memory cells working on opposite phases of a clock signal in order to give a continuous output current.

As mentioned previously, the current memory cell is not used exclusively in a delta sigma converter. Minor changes may be made to the circuitry described above in order to calibrate the magnitude of the output current rather than the charge injected. This would be achieved by removing the AND gate and calibrating with a continuous DC current. This would make the current memory cell suitable for general use as a precision digital-to-analog converter either stand alone or embedded in a pipeline device. The only restriction to the applicability of the present invention is that the cell must be regularly addressed by a clock in order to allow the calibration sequence to occur.

I claim:

1. A current memory cell comprising a first current terminal and an output current terminal, a first transistor connected to form a current source, transistor means connected between said first and output current terminals and said current source whereby to selectively connect the current source to either the first current terminal or the output current terminal, and means for trimming the current source wherein the current source comprises a bipolar transistor and the trimming means comprises a field effect transistor.

2. A current memory cell according to claim 1, wherein the bipolar transistor has a resistor in its emitter circuit and the field effect transistor is connected in parallel with the resistor.

3. A current memory cell according to claim 1, and comprising second and third bipolar transistors where emitters are connected together to form a long tailed pair circuit, the collector of the first transistor being connected to the common emitter connection of the long tailed pair and the collector of one of the second and third bipolar transistors being connected to the transistor means.

4. A current memory cell according to claim 3, and comprising a logic circuit having a first input connected to a clock signal and a second input connected to a data input and outputs connected to the bases of the second and third bipolar transistors.

5. A current memory cell according to claim 1, and comprising a control transistor for controlling the operation of the field effect transistor forming the trimming means.

6. A current memory cell according to claim 1, wherein the transistor means are formed by two field effect transistors.

* * * * *